United States Patent
Akerib

(10) Patent No.: US 9,197,248 B2
(45) Date of Patent: Nov. 24, 2015

(54) LOW DENSITY PARITY CHECK DECODER

(75) Inventor: Avidan Akerib, Tel Aviv (IL)

(73) Assignee: MIKAMONU GROUP LTD., Tel Aviv (IL)

( * ) Notice: Subject to any disclaimer, the term of this patent is extended or adjusted under 35 U.S.C. 154(b) by 0 days.

(21) Appl. No.: 13/483,290

(22) Filed: May 30, 2012

(65) Prior Publication Data

US 2012/0311404 A1 Dec. 6, 2012

Related U.S. Application Data

(60) Provisional application No. 61/491,236, filed on May 30, 2011, provisional application No. 61/531,425, filed on Sep. 6, 2011, provisional application No. 61/533,273, filed on Sep. 12, 2011.

(51) Int. Cl.
*H03M 13/11* (2006.01)
*G11C 15/00* (2006.01)

(52) U.S. Cl.
CPC ........ *H03M 13/1122* (2013.01); *H03M 13/114* (2013.01); *H03M 13/1137* (2013.01); *H03M 13/1165* (2013.01); *G11C 15/00* (2013.01)

(58) Field of Classification Search
CPC ............ H03M 13/41; H03M 13/1102; H03M 13/116; H03M 13/1137; H03M 13/1111; H03M 13/1165; H03M 13/152; H03M 13/255; H03M 13/2906; H03M 13/1122; H03M 13/114; H04L 1/0057; H04L 1/005; G11C 15/00; G11C 15/04; G11C 15/043; G11C 2029/0409; G11C 2207/104
USPC .................................................. 714/758, 763
See application file for complete search history.

(56) References Cited

U.S. PATENT DOCUMENTS

| 5,974,521 | A | 10/1999 | Akerib | |
| 6,978,343 | B1 * | 12/2005 | Ichiriu | 711/108 |
| 7,216,284 | B2 * | 5/2007 | Hsu et al. | 714/766 |
| 7,257,763 | B1 * | 8/2007 | Srinivasan et al. | 714/764 |
| 7,571,371 | B2 * | 8/2009 | Wickeraad | 714/763 |
| 7,689,889 | B2 * | 3/2010 | Cohen | 714/759 |
| 7,761,768 | B2 * | 7/2010 | Chun et al. | 714/752 |
| 7,934,139 | B2 * | 4/2011 | Andreev et al. | 714/752 |
| 8,166,364 | B2 * | 4/2012 | Patapoutian et al. | 714/752 |
| 8,196,017 | B1 * | 6/2012 | Gupta | 714/763 |
| 8,413,013 | B2 * | 4/2013 | Toda | 714/763 |
| 8,464,142 | B2 * | 6/2013 | Gunnam et al. | 714/786 |
| 2012/0110411 | A1 * | 5/2012 | Cheung et al. | 714/758 |

OTHER PUBLICATIONS

"Low cost LDPC decoder for DVB-S2", John Dielissen, Andries Hekstra, Vincent Berg; 3-9810801-0-6, Proceedings of the conference on Design, automation and test in Europe: Designers' forum—European Design and Automation Association; pp. 130-135.

"Area-Efficient Min-Sum Decoder Design for High-Rate QC-LDPC Codes in Magnetic Recording", Hao Zhong, Wei Xu, Nindge Xie, and Tong Zhang; IEEE Transactions on Magnetics, ISSN 0018-9464, vol. 43 , Issue 12, pp. 4117-4122.

"Architecture-Aware LDPC Code Design for Multi-Processor Software Defined Radio Systems", Yuming Zhu, Chaitali Chakrabarti; IEEE Transactions on Signal Processing, vol. 57 , Issue 9, pp. 3679-3692.

* cited by examiner

*Primary Examiner* — James C Kerveros

(74) *Attorney, Agent, or Firm* — Eitan, Mehulal & Sadot

(57) ABSTRACT

An error correction code decoder, including a computational memory array having at least a variable node section, a check node section, and a plurality of computational memory cells, each cell capable of storing at least one bit of memory and of performing operations at least on the bit and each cell implementing one node. A controller instructs the computational memory to perform the operations and to write the results of computations on a block of variable nodes into associated set of blocks of check nodes and to write the results of computations on a block of check nodes into associated set of blocks of variable nodes.

6 Claims, 5 Drawing Sheets

LOW DENSITY PARITY CHECK DECODER

CROSS-REFERENCE TO RELATED APPLICATIONS

This application claims benefit from U.S. Provisional Patent Application U.S. 61/491,236 filed 30 May 2011; U.S. 61/531,425 filed 6 Sep. 2011; and U.S. 61/533,273 filed on 12 Sep. 2011; all of which are hereby incorporated in their entirety by reference.

FIELD OF THE INVENTION

The present invention relates to error correction in signal processing generally and to a low density parity check (LDPC) decoder in particular.

BACKGROUND OF THE INVENTION

The low density parity check (LDPC) code is an error correction code (ECC) used in signal processing. ECC codes are used to detect and correct errors which may be introduced into a signal due to noise or other types of interferences. These errors usually occur as changes to one or more bit values in the signal; that is, the value of one or more bits may change from a "0" to a "1" or the inverse, modifying the information contained in the original signal. Using ECC, the original signal may be substantially reconstructed and the original information contained therein retrieved.

Developed by Robert Gallager in the early 1960's, the use of LDPC codes for error correction has experienced a rise in popularity over the last decade due to its relatively low complexity and increased error correction performance compared to other EECs. This increase in popularity has been further supported by advances in processing device technology which allow LDPC decoders to be readily implemented in small chips, for example, in a dedicated chip such as an ASIC (application specific integrated circuit), as well as in other types of integrated circuits.

LDPC codes may be graphically represented by a Tanner Graph. The Tanner Graph is a bipartite graph with a set of nodes on one side generally referred to as "variable" nodes, and a set of nodes on a second side opposing the variable nodes and generally referred to as "check" nodes. The variable nodes contain information (bits) received in a message which is to be decoded for reconstructing the original message. The check nodes contain parity-check constraints, also known as parity equations, to which the information in the variable nodes is compared for detecting and correcting errors introduced into the received information. The variable nodes and the check nodes are connected by edges, which may be randomly selected, so that one or more variable nodes may connect to one or more check nodes. In a typical Tanner Graph, a variable node will be connected to a plurality of check nodes, and a check node will be connected to a plurality of variable nodes.

Error correction using the Tanner Graph includes use of iterative decoding algorithms. The information received at each variable node is broadcast to all its edge-connected check nodes, and each check nodes responds to each of its edge-connected variable nodes by returning information comparing all the variable node information received (from all the nodes) to the parity-check constraints. This process is generally iterated until convergence, which may be when all the parity-check constraints have been met or when a bit error rate (BER) does not exceed a predetermined value. Iterative decoding algorithms for use with the Tanner Graph are known in the art and therefore no further elaboration is provided herein. Some examples of LDPC decoders and decoder algorithms are described below.

"Low cost LDPC decoder for DVB-S2", John Dielissen, Andries Hekstra, Vincent Berg; 3-9810801-0-6, Proceedings of the conference on Design, automation and test in Europe: Designers' forum—European Design and Automation Association; Pages 130-135.

"Area-Efficient Min-Sum Decoder Design for High-Rate QC-LDPC Codes in Magnetic Recording", Hao Zhong, Wei Xu, Nindge Xie, and Tong Zhang; IEEE Transactions On Magnetics, ISSN 0018-9464, Volume 43, Issue 12, Pages 4117-4122.

"Architecture-Aware LDPC Code Design For Multi-Processor Software Defined Radio Systems", Yuming Zhu, Chaitali Chakrabarti; IEEE Transactions on Signal Processing, Volume 57, Issue 9, Pages 3679-3692.

SUMMARY OF THE PRESENT INVENTION

There is provided, in accordance with an embodiment of the present invention, an error correction code decoder comprising a computational memory array having at least a variable node section and a check node section, the computational memory array comprising a plurality of computational memory cells, each cell capable of storing at least one bit of memory and of performing operations at least on the bit and each cell implementing one node; and a controller to instruct the computational memory to perform the operations and to write the results of computations on a block of variable nodes into its associated set of blocks of check nodes and to write the results of computations on a block of check nodes into its associated set of blocks of variable nodes.

In accordance with an embodiment of the present invention, each the computational memory cell is one of the following: a content addressable memory (CAM) cell, a TCAM (Ternary Content-Addressable Memory) cell and a memory cell capable of comparing input data against stored data and of returning output data responsive to the comparison.

In accordance with an embodiment of the present invention, the decoder comprises an I/O (input/output) interface to receive data to be decoded, the I/O interface providing the data to the controller and the controller writing the data to selected ones of the variable nodes.

In accordance with an embodiment of the present invention, the decoder is implemented on a memory storage chip.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 3A and 3B illustrate execution of exemplary "compare" and "write" instructions by the computational memory in the LDPC decoder, according to an embodiment of the present invention;

FIGS. 3C and 3D illustrate execution of exemplary "compare" and "write" instructions including a cyclic shift by the computational memory, according to an embodiment of the present invention.

Figure 1:
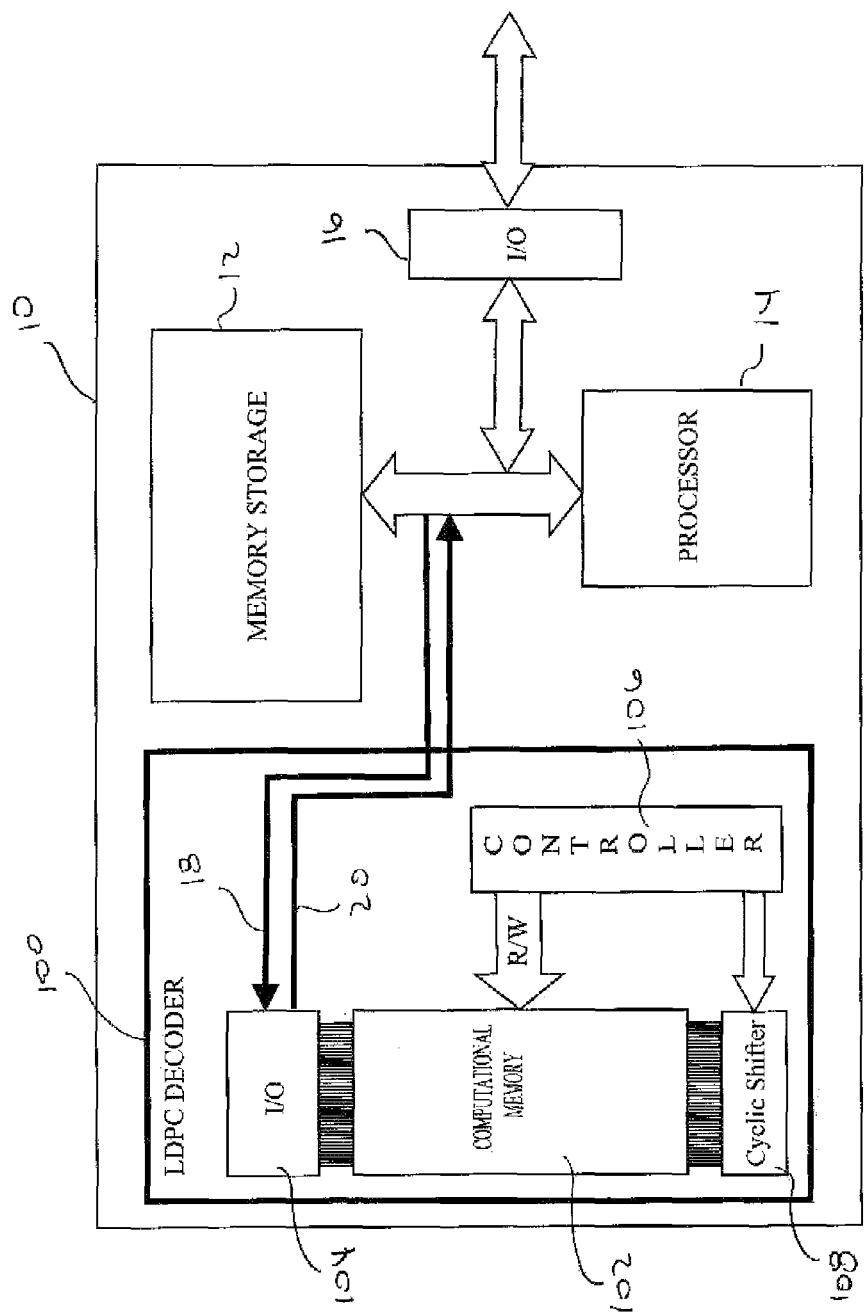
FIG. 1 schematically illustrates a functional block diagram of an exemplary device including an LDPC decoder, according to an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that a LDPC decoder may be implemented by applying an iterative decoding algorithm to memory cells in a computational memory. The algorithm may be a linear decoding algorithm and may be based on, for example, the Tanner Graph. The decoder may be implemented by assigning functions associated with variable nodes in the Tanner Graph to some of the memory cells and functions associated with check nodes in the graph to other memory cells. For clarity, memory cells assigned the functions of variable nodes may be referred to hereinafter as variable node cells (VNCs) and those assigned the functions of check nodes may be referred to as check node cells (CNCs). Information contained in received messages may be placed in the VNCs and the parity-check constraints may be placed in the CNCs. The iterative decoding algorithm may then be applied by having each VNC initially broadcast the information contained therein in parallel to one or more CNCs for comparing with the parity-check constraints, and by having each CNC respond by sending in parallel to all the connected VNCs the result of the comparisons performed. This process may be repeated until convergence. The algorithm may further be applied by having all the VCNs broadcasting together during a same time slot and all the CNCs responding together also during a same time slot. Consequently, relatively large amounts of information may be transferred in parallel inside the memory between the VCNs and the CNCs using a minimal number of time slots, potentially providing for rapid convergence.

The computational memory may be a CAM (Content-Addressable Memory), a TCAM (Ternary Content-Addressable Memory) or any other type of memory which may be capable of comparing input data against stored data and of returning output data responsive to the comparison. The computation memory may operate according to associative processing principles such as described in U.S. Pat. No. 5,974,521 (to Akerib) by the Applicant which disclosure in incorporated herein by reference.

Reference is now made to FIG. 1 which schematically illustrates a functional block diagram of an exemplary device 10 including an LDPC decoder 100, according to an embodiment of the present invention. Device 10 may be a computing unit or other electronic device which may perform signal processing or may use ECC in any of its applications, such as, for example, a communication device, a data storage device, or an imaging device. Device 10 may further include a memory storage unit 12, a processor unit 14, and/or an I/O interface unit 16 depending on the type of device and its application.

In accordance with an embodiment of the present invention, LDPC decoder 100 may be used for correcting data 18 received from memory storage unit 12, from processing unit 14, and/or received by device 10 through I/O interface unit 16, by executing an iterative decoding algorithm on the received data. The decoding algorithm may be a linear decoding algorithm and may be based on the Tanner Graph. Alternatively, the decoding algorithm may also be a non-linear decoding algorithm.

In accordance with an embodiment of the present invention, the LDPC decoder 100 includes a computational memory 102, a controller 106, a I/O 104, and a cyclic shifter 108.

Applicants have realized that the decoding algorithm may be applied in a computational memory 102 where the received data 18 may be stored in the VNCs. Also stored in computational memory 102 may be parity bits associated with parity equations. These may be stored in the CNCs. The VNCs and the CNCs may be grouped into node blocks for facilitating data processing within computational memory 102. These node blocks may be referred to hereinafter as variable node blocks (VNBs) and check node blocks (CNBs), respectively. As part of the decoding process, computational memory 102 iteratively compares data stored in the VNBs with those stored in the CNBs, and outputs data responsive to the processing of the comparisons. This output data may include the result of vector operations performed on the VNBs and the CNBs, which may include functions such as SUM, ABSOLUTE VALUES, MEAN, MAX, MIN, NEXT MIN, XOR, among others. The output data may be further processed in computational memory 102, and may include shifting data within the memory. This data shifting may include cyclical shifting of data stored in the VNBs and CNBs and/or data transfer to other locations in memory. Data shifting may also be performed prior to the vector operations.

Data 18 may be received by LDPC decoder 100 through an I/O 104 which inputs the information in parallel to computation memory 102. I/O 104 may include FIFO (first in-first out) buffering. I/O 104 may also serve to transfer output data 20 from computational memory 102 to memory storage unit 12, processor unit 14, or out of device 10 through I/O interface unit 16, depending on the device and the application.

Read and write instructions for data in computational memory 102 may be provided by a controller 106. Controller 106 may also provide other operating instructions associated with comparing data inside computational memory 102 as required for the decoding process. These instructions may be associated with performing vector operations, and possible further processing of the output data. Controller 106 may also operate on a cyclic shifter 108 in LDPC decoder 100 which cyclically shifts the data in the VNBs and CNBs. Controller 106 may also operate on I/O 104 for controlling buffering and data flow through the I/O.

Figure 2:
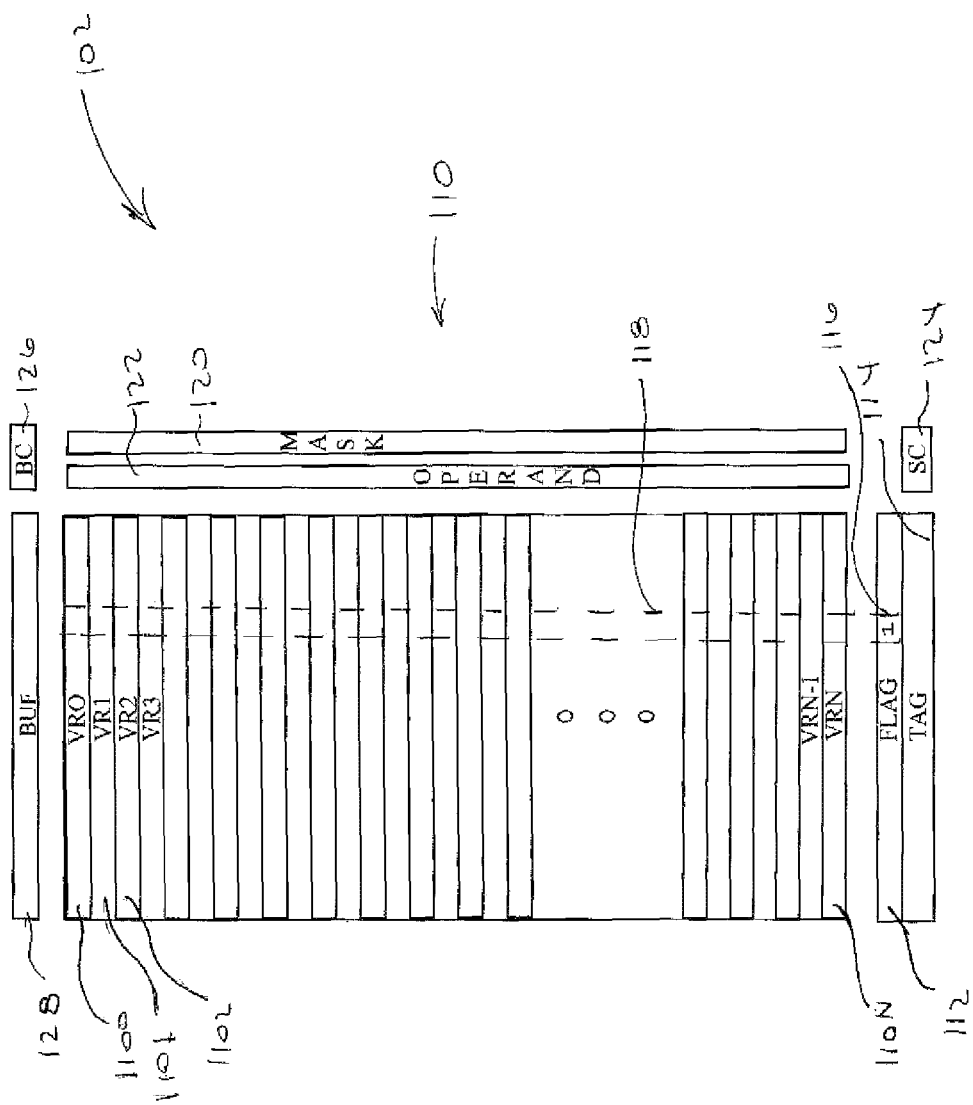
FIG. 2 schematically illustrates an exemplary node block in a computational memory used with an LDPC decoder, according to an embodiment of the present invention.

Reference is now made to FIG. 2 which schematically illustrates an exemplary node block 110 in computational memory 102, according to an embodiment of the present invention.

In accordance with an embodiment of the present invention, computational memory 102 includes a plurality of node blocks 110, each node block having a plurality of vector registers VR0-VRN, for example VR0 1100, VR1 1101, VR2 1102, and VRN 110N. Each vector register in a node block may include a plurality of VNCs or alternatively a plurality of CNCs. A node block 110 including vector registers with VNCs is a VNB and a node block including vector registers with CNCs is a CNB.

A size of node block 110 may be flexible, possibly limited by technical constraints associated with the size of computational memory 102. That is, the length of vector registers VR0-VRN as well as the number of vector registers in block 10 may be varied to allow mapping of the data in the variable nodes and the check nodes in the Tanner Graph into node block 10. Furthermore, a number of node blocks 10 in computational memory 102 may be varied to allow mapping of blocks of variable nodes and check nodes in the graph into VNBs and CNBs respectively.

For example, assuming that each variable node in the Tanner Graph includes 144 bits, and that the variable nodes may be grouped into blocks of 100 nodes, then each VNB in computational module 102 may be required to accommodate 14,400 bits. One possible VNB configuration may include dividing the VNB into 18 vector registers each 100 bytes long. Received data associated with each variable node in the Tanner Graph may then be mapped as one byte in each vector register (occupying total 144 bytes). Alternatively, the received data may be mapped using other combinations, for example, by occupying more bytes in each vector register such as 2 bytes in 9 vector registers instead of 1 byte in 18 vector registers. Similarly, assuming that each check node in the Tanner Graph includes 1024 bits and connects to 10 variable nodes (degree 10), and there are 100 check nodes in each CNB, then each CNB may be required to accommodate 102, 400 bits. One possible CNB configuration may include dividing each CNB into 128 vector registers each 100 bytes long, corresponding with the vector length arrangement of the VNB. Alternatively, the parity bits may be mapped using other combinations which may correspond with the distribution in the vector registers in the VNB, for example, by occupying 2 bytes in 64 vector registers instead of 1 byte in 128 vector registers.

Vector operations may be carried across vector registers in a single node block 110 or vector registers located in separate node blocks. These operations may span across vector registers and/or node blocks which are not physically located adjacent to one another. The following are some examples of vector operations which may be carried out within a node block 10:

VR3=VR0+VR1+VR2 (sum vectors from VR0, VR1, and VR2 into VR3);

VR6=SUM(VR0,VR5) (sum all vector between VR0 to VR5 into VR6);

VR8=MIN(VR0, VR7) (compute minimum values for all vectors from VR0 to VR7 and place the resultant value in VR8);

VR9=MIN2(VR0, VR7, VR8) (compute the second minimum values for all vectors from VR0 to VR7 to VR9 and place the first minimum into VR8);

VR15=MXOR(VR0,VR9) (Xor all variables between VR0 to VR9 and place in VR15);

VR0=XOR(V0,VR3) (Xor between VR0 and VR3);

T=VR5 (move VR5 to the TAG register which is described below); and

VR0=(VR1+ShiftLeft(VR1,8))/2 (Cyclic shift left F1 8 bits (1 byte) via T, add it to the unshifted VR1 and divide the result by 2–average a vector with its neighbor).

The vector operations may be carried out across different node blocks by specifying the vector registers involved in the operation. For example, if there are 4 node blocks, VBN0 (VR0-VR17), VBN1 (VR18-VR35),VBN2 (VR36-VR53), and CBN1(VR54-VR71), then an exemplary instruction may be:

VR62=MIN2(VR0, VR59, VR63) (compute the second minimum values for all vectors from VR0 to VR59 to VR62 and place the first minimum into VR63).

Additionally or alternatively, the vector operations may be carried out across different node blocks by specifying the node block number and the vector register involved in the operation. For example, if there are four node blocks VBN0 (VR0-VR17), VBN1(VR0-VR17), VBN2 (VR0-VR 17), and CNB1 (VR0-VR128), then an exemplary instruction may be:

VNB1.VR0=VNB 2.VR13 (move VR0 in VNB1 to VR13 in VNB2);

MoveBlocks (CNB1.VR100, {VBN0.VR5,VBN1.VR8, VBN2.VR3}) (move VR100 in CNB1 to VR8 in VBN1, to VR5 in VBN0, and to VR3 in VBN2, all at the same clock).

Additionally included in node block 110 are two dedicated registers which operate on the block, a flag vector (FLAG, F) 112 and a tag vector (TAG, T) 114. Flag vector 112 and tag vector 114 may be of a same length as the vector registers. Flag vector 112 may indicate which bit or bits in each vector are taking part in an operation. For example, referring to FIG. 2, if there is a "1" in a flag vector cell 116, then all bits in cells in VR0-VRN located in column 118 above the flag vector cell may take part in the operation. Tag vector 114 is a vector register similar to any one of VR0-VRN but may have cyclic shifting capability for shifting data in the register by one or more cells. For example, the cyclic shift may be by 1 cell, 2 cells, 3 cells, 8 cells, or more. Shifting in tag vector 114 may be limited to only one direction, for example, to the left or alternatively to the right, or may be be not be limited and may be in either direction.

In accordance with an embodiment of the present invention, block 110 additionally includes a mask register (MASK) 120 and an instruction operand register (OPERAND) 122 through which control commands may be provided for carrying out vector operations within the block and/or between blocks. Mask register 120 may point to all vector registers VR0-VRN in block 110 for indicating which vectors may take part in an operation. Operand register 122 may specify the vector operation to be carried out.

Further included in block 110 may be a cyclic shift control register 124 which may serve for specifying when a cyclic shift is to be carried out in tag register 114, and may include information as to a direction and a number of cells to be shifted. Additionally included may be a buffer control register 126 which may serve for controlling a buffer vector register 128 through which data 18 is input to computational memory 102 and through which decoded output data 20 exits from the computational memory. Buffer vector register 128 may be included in I/O 104. Buffer register 128 may be a single register or an array of registers in each node block, or may be one or more arrays of registers connecting to one or more node blocks.

Figures 3A, 3B:
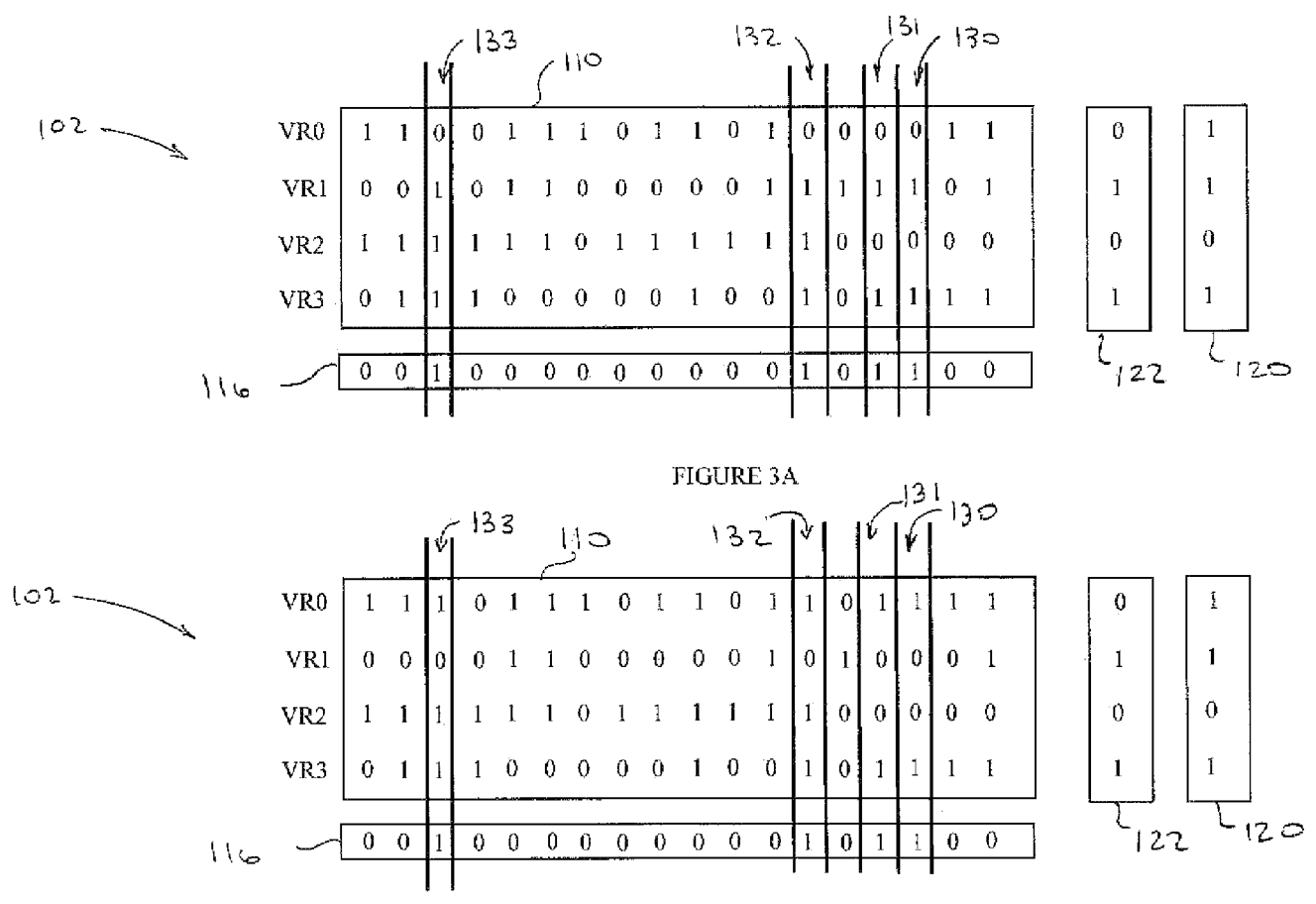

Reference is now made to FIGS. 3A and 3B which illustrate execution of exemplary "compare" and "write" instructions by computational memory 102, according to an embodiment of the present invention. For illustrative purposes, execution of the instructions are carried out using only four vector registers designated VR0-VR3 in node block 110.

FIG. 3A shows the execution of the "compare" instruction performed by computational memory 102. Mask register 120 is set to 1101 and operand register 122 is set to a "compare" instruction using the value 01Ø1 where Ø indicates "does not care what the value is". Setting mask register to 1101 places pointers on vectors registers VR0, VR1 and VR3 (conforming to a "1" in the mask register) which indicates these are the vectors to be operated on. Computational memory 102 then executes a vector operation comparing the values in these vectors to that in operand register 122 and if the values match, a 1 is placed in tag register 116. The results of the compare by computational memory 102 are shown in columns 130, 131, 132, and 133 which all have a 0 in VR0, a 1 in VR1 and a 1 in VR3, matching the value 01Ø1 in operand register 122. The value in vector VR2 is not important (mask register 120 does not point at VR2 and operand register 122 does not care what the value at VR2 is so that it may be a 1 or a 0). The value of 1 is placed in tag register 116 in the cell positions corresponding with columns 130, 131, 132, and 133, responsive to the match.

FIG. 3B shows the execution of the "write" instruction performed by computational memory 102 following the "compare" operation. Mask register 120 is left at 1101 indicating that the "write" operation will be carried out on vectors VR0, VR1, and VR3. Operand register 122 is set to a "write" instruction using the value 1011. Computational memory 102 performs the "write" instruction by placing the value 10X1 in all columns corresponding to the cell locations having a 1 in tag register 116, that is, columns 130, 131, 132, and 133. The first value of 1 is placed in VR0, the second value of 0 is placed in VR2, the third value of 1 is not written as this corresponds with register VR3 which is not pointed at by mask register 120, and the fourth value 1 is written into VR4.

As may be appreciated by comparing FIGS. 3A and 3B, the execution of "compare" and "write" instructions by computational memory 102 resulted in the value 0101 in column 130 being replaced by 1001, the value 0101 in column 131 being replaced by 1001, the value 0111 in column 132 being replaced by 1011, and the value 0111 in column 133 being replaced by 1011.

Figures 3C, 3D:
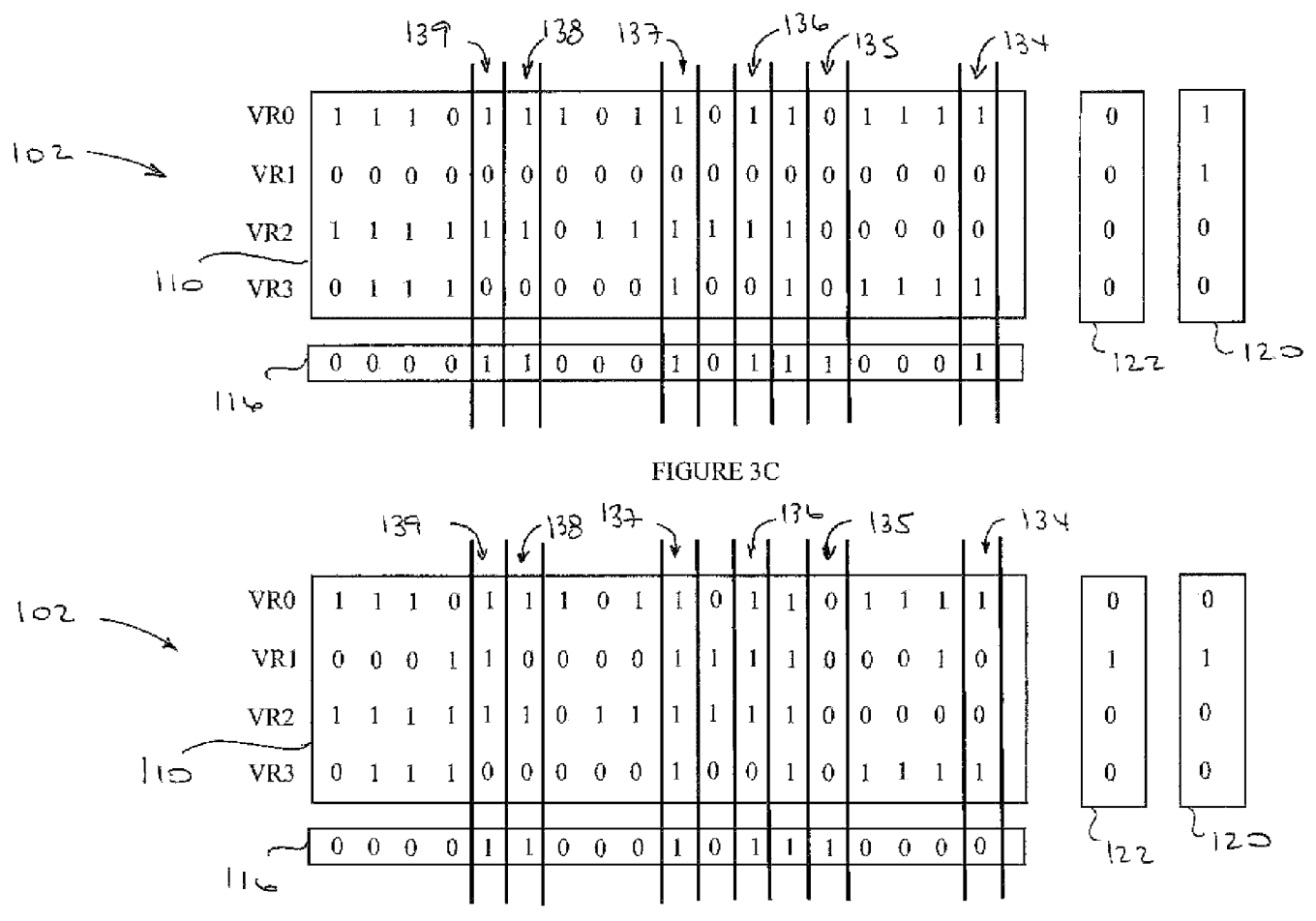

Reference is now made to FIGS. 3C and 3D which illustrate execution of exemplary "compare" and "write" instructions including a cyclic shift by computational memory 102, according to an embodiment of the present invention. For illustrative purposes, execution of the instructions are carried out on vectors VR0-VR3 shown in FIG. 3B following the execution of the previously described "compare" and "write" instruction by computational memory 102.

FIG. 3C shows an execution of "write" instructions performed by computational memory 102 following execution of "compare" instructions (the execution of the "compare" instructions is not shown). Mask register 120 is set to 0100 and operand register 122 is set to a "write" instruction using the value 0000. In a previous step, mask register 120 was set a value of 0100 setting the pointer at vector register VR1, and operand register 122 was set to a "compare" instruction using the value 0100. During the "compare" step vector register VR1 had values of 1 in memory cells corresponding to columns 134, 135, 136, 137, 138, and 139. A value of 1 was placed in tag register 116 in the memory cells corresponding to these columns During the "write" step, mask register is still set at 0100 so that the value of 0 is placed in VR1 in memory cells located in the columns corresponding to the memory cells in tag register 116 having the value of 1 (columns 134-139).

FIG. 3D shows the execution of a second "write" instruction following a cyclic shift of 1 cell to the left. Mask register 120 is set at a value of 0100 (no change from before) and operand register 122 includes a "write" instruction having a value of 0100. Computational memory 102 performs the "write" instruction by shifting the value X1XX into columns one cell to the left of all columns corresponding to the cell locations having a value of 1 in tag register 116 (columns 134, 135, 136, 137, 138 and 139). The first, third and fourth values of 0 are not written as these correspond with registers VR0, VR2, and VR3 which are not pointed at by mask register 120, and the second value 1 is written into VR1.

Figure 4:
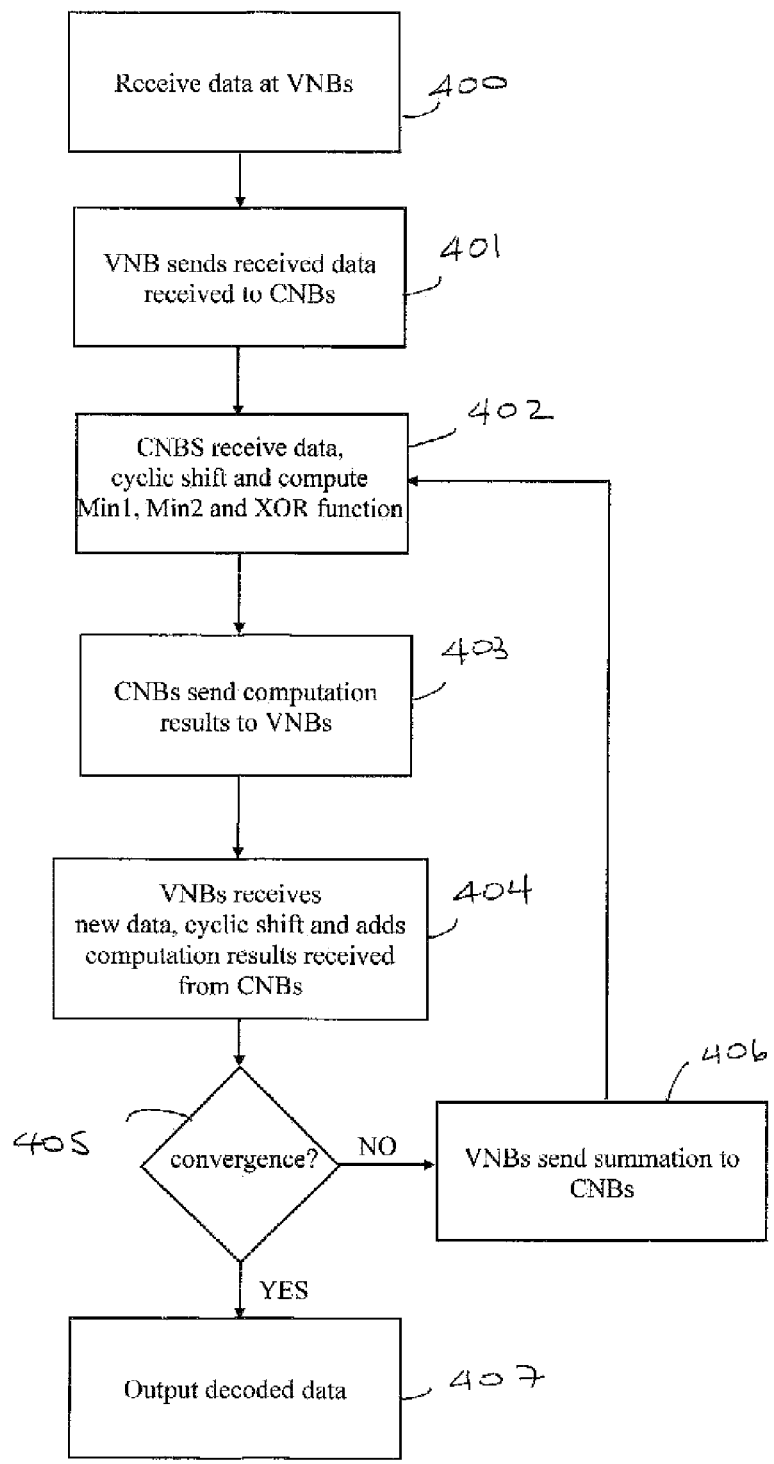
FIG. 4 is an exemplary flow chart of a method of error correction using an LDPC decoder including a computational memory, according to an exemplary embodiment of the present invention.

Reference is now made to FIG. 4 which is an exemplary flow chart of a method of error correction using an LDPC decoder including a computational memory, according to an exemplary embodiment of the present invention. In describing the method, reference may be made to LDPC decoder 100 and to its components.

At 400, data 18 may be received by decoder 100 through I/O 104 and transferred to computational memory 102. The data may be distributed through buffer register 128 to the plurality of VNBs in computational memory 102 according to a size of the VNBs (length of the vector registers, for example, 100 bytes long, and number of vector registers in the block, for example 18).

At 401, each VNB broadcasts the data it contains to all CNBs connected to it, the connection topology based on the Tanner Graph or other bipartite connection topology. The connection of the VNBs to the CNBs may be randomly established or may be based on predetermined criteria. Broadcasting may be performed by all the VNBs in parallel during a same time slot which may include one or more clock cycles.

At 402, each CNB receives the broadcasted data from the VNBs connected to it and may cyclically shift the received data. The shift may be a horizontal shift and may cover a length of up to 32 bits, optionally more, to the left or the right of the received location. Each CNB may perform vector operations on the received data which may include the following steps, not necessarily in the described order:

a. compute a summation of all the data received from all VNBs connected to it and subtract the previously stored sum (prior to the first iteration the previously stored value is 0);

b. compute $1^{st}$ minimum with truncation of absolute values of summation (computation of absolute values may not be performed if sign and magnitude are included);

c. compute $2^{nd}$ minimum with truncation of absolute values of summation (computation of absolute values may not be performed if sign and magnitude are included);

d. compute XOR for all sign bits;

e. compute output vector and store for subtracting in next iteration.

At 403, each CNB sends the $1^{st}$ min, $2^{nd}$ min, and result of XOR to all connected VNBs. A cyclic shift may be applied to any one or all of the $1^{st}$ min, $2^{nd}$ min, and the XOR results prior to sending.

At 404, each VNB receives the $1^{st}$ min, $2^{nd}$ min and the XOR result from each CNB connected to it, and may cyclically shift all the received data from the CNBs. The VNB may select between the $1^{st}$ minimum and the $2^{nd}$ minimum by comparing the $1^{st}$ minimum to the value in VNB from the previous iteration. If the values are the same, then the $2^{nd}$ minimum is selected as the correct value. If not equal, then the $1^{st}$ minimum is selected as the correct value.

At 405, convergence is checked. If converged, go to 407. If no go to 406.

At 406, the VNBs retransmit the summed received signal to the CNBs. The retransmission may include new data received in the decoder.

At 407, the decoded signal is output from computational memory 102 through I/O 104 out of decoder 100.

Applicants have further realized that the use of computational memory in the LDPC decoder is potentially advantageous over the art. One potential advantage is increased throughput as data transfer between the VNCs and the CNCs is done in parallel through the bit lines in the memory and not through an externally connected processor as known in the art. Other potential advantages include reduced chip size and low power consumption as the externally connected processor, as well as external decoding circuitry connected to the variable nodes and the check nodes, are not required.

Applicants have further realized that an LDPC decoder not having externally connected processing and/or decoding circuitry may operate at higher clock speeds compared to decoders known in the art. A potential advantage of using higher clock speeds is increased throughput. Another potential advantage includes a possible reduction in the size of the computational memory by reducing the number of VCNs as they may be accessed more frequently due to the higher clock speed.

Unless specifically stated otherwise, as apparent from the preceding discussions, it is appreciated that, throughout the specification, discussions utilizing terms such as "processing," "computing," "calculating," "determining," or the like, refer to the action and/or processes of a computer, computing system, or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operations herein. This apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk, including floppy disks, optical disks, magnetic-optical disks, read-only memories (ROMs), compact disc read-only memories (CD-ROMs), random access memories (RAMs), electrically programmable read-only memories (EPROMs), electrically erasable and programmable read only memories (EEPROMs), magnetic or optical cards, Flash memory, non-volatile memory, or any other type of media suitable for storing electronic instructions and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A low-density parity check (LDPC) decoder comprising:
    a computational memory array having at least a variable node section comprising at least one block of variable nodes and a check node section comprising at least one block of check nodes associated with said least one block of variable nodes, said block of variable nodes and said associated block of check nodes comprising a plurality of computational memory cells, each cell capable of storing at least one bit of memory and of performing operations at least on said bit and a group of cells implementing one node; and
    a controller to instruct said computational memory to:
        perform said operations inside said computational memory on said block of variable nodes and
        write results of computations associated with said variable node operations into said associated block of check nodes; and
        perform said operations in said computational memory on said associated block of check nodes and
        write results of computations associated with said check node operations into said associated block of variable nodes,
        wherein said results of said computations associated with said variable node operations and said check node operations are transferred between said block of variable nodes and said block of associated check nodes through bit lines in said computational memory.

2. The decoder according to claim 1 and wherein each said computational memory cell is one of the following: a content addressable memory (CAM) cell, a TCAM (Ternary Content-Addressable Memory) cell and a memory cell capable of comparing input data against stored data and of returning output data responsive to the comparison.

3. The decoder according to claim 1 and also comprising an I/O (input/output) interface to receive data to be decoded, said I/O interface providing said data to said controller and said controller writing said data to selected ones of said variable nodes.

4. The decoder according to claim 1 and implemented on a memory storage chip.

5. The decoder according to claim 1 wherein said computational memory array is a content-addressable memory (CAM).

6. The decoder according to claim 1 wherein said computational memory array is a ternary content-addressable memory (T-CAM).

* * * * *